United States Patent [19]

Inoue

[11] Patent Number: 5,252,173

[45] Date of Patent: Oct. 12, 1993

[54] PROCESS FOR GROWING SEMICONDUCTOR LAYER ON SUBSTRATE

[75] Inventor: Toshikazu Inoue, Kawasaki, Japan

[73] Assignee: Fujitsu Limited, Kawasaki, Japan

[21] Appl. No.: 796,442

[22] Filed: Nov. 22, 1991

[30] Foreign Application Priority Data

Nov. 28, 1990 [JP] Japan ................................. 2-322634

[51] Int. Cl.$^5$ .......................................... C30B 25/10
[52] U.S. Cl. ..................... 156/610; 156/613; 156/614; 156/DIG. 73; 156/603; 437/132; 437/133
[58] Field of Search ............... 156/603, 610, 613, 614, 156/DIG. 73; 437/248, 132, 133

[56] References Cited

U.S. PATENT DOCUMENTS

| | | | |
|---|---|---|---|
| 3,729,348 | 4/1973 | Saul ..................................... | 437/248 |
| 4,863,877 | 9/1989 | Fan et al. ........................... | 156/603 |
| 5,011,794 | 4/1991 | Grim et al. ......................... | 437/247 |
| 5,061,642 | 10/1991 | Fujioka et al. ..................... | 437/248 |

FOREIGN PATENT DOCUMENTS 1-246818 10/1989 Japan .

OTHER PUBLICATIONS

Shimizu et al., "Dislocation Density Studies in MOCVD GaAs on Si Substrates", Journal of Crystal Growth, vol. 93 (1988), pp. 475–480.
Appl. Phy. Lett. 56 (22) 2225–2227 (1990), May 28, Tachikawa et al., "Dislocation Generation of GaAs on Si in the Cooling Stage".

*Primary Examiner*—Robert Kunemund
*Attorney, Agent, or Firm*—Staas & Halsey

[57] ABSTRACT

A monocrystalline layer of a III-V type or II-VI type compound semiconductor is epitaxially grown on a silicon substrate, and then subjected to a plurality of reheating steps during the cooling stage, wherein at least one of the upper limit temperatures of the reheating steps is lower than that used in the growing stage. The etch pit density is reduced to less than $10^6 \, cm^{-2}$.

12 Claims, 4 Drawing Sheets

O: AMOUNT OF ELEVATING TEMPERATURE 200°C

●: AMOUNT OF ELEVATING TEMPERATURE 300°C

×: PRIOR ART

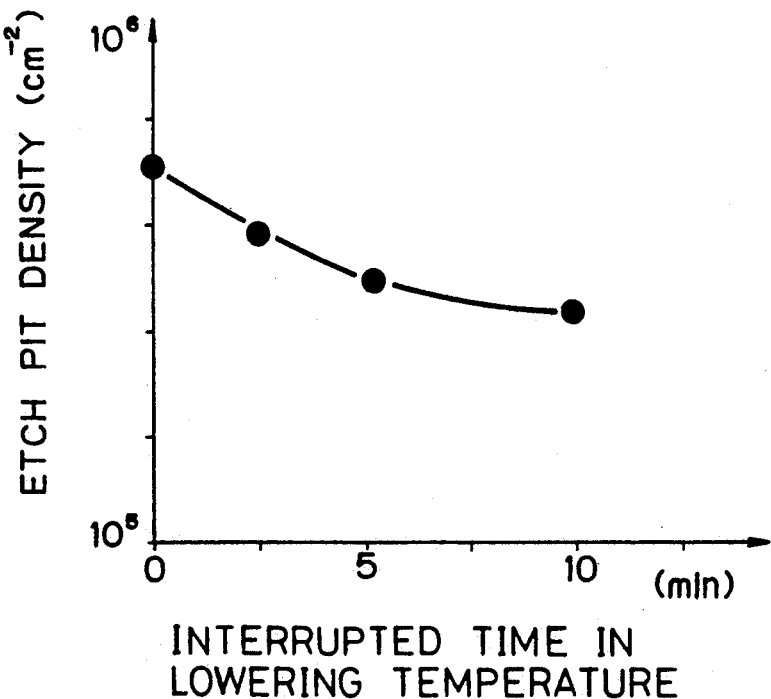

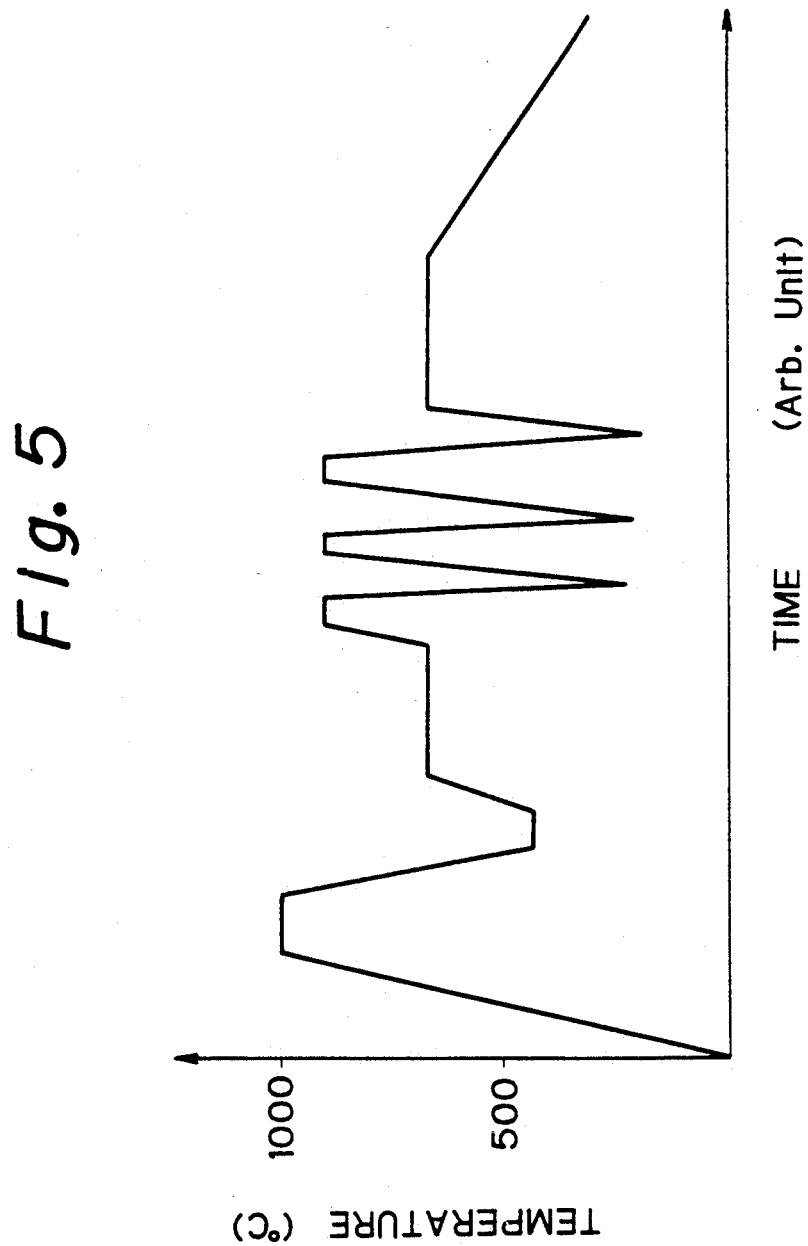

PROCESS FOR GROWING SEMICONDUCTOR LAYER ON SUBSTRATE

BACKGROUND OF THE INVENTION

The present invention relates to a process for growing a layer of a semiconductor on a substrate of a material having a lattice constant which does not conform to that of the semiconductor.

DESCRIPTION OF THE RELATED ART

There is now a need in the semiconductor industry to develop electronic devices capable of operating at higher and higher speeds, such as those comprising a GaAs type compound semiconductor, which exhibits a faster electron mobility than that of silicon. Nevertheless, it is difficult to produce a large-diametered substrate of GaAs. Also, a compound semiconductor has a lower mechanical strength than that of silicon, and therefore, many attempts have been made to epitaxially grow a III-V type or II-VI type compound semiconductor layer on a silicon substrate.

Usually, such a compound semiconductor layer is formed by metallorganic chemical vapor phase deposition or molecular beam epitaxy or atomic layer epitaxy, but the crystal lattice constant of a compound semiconductor does not conform to that of silicon, and thus dislocations of the crystal lattice of the compound semiconductor are generated at the interface between the layer and the substrate, during the cooling stage after the layer of the compound semiconductor has been formed on the silicon substrate. Such dislocations of the crystal lattice of the compound semiconductor reach the surface of the layer, and make it impossible to produce semiconductor devices in the compound semiconductor layer.

T. Omachi et al. disclose, in Japanese Unexamined Patent Publication No. 1-246818 assigned to Nippon Denshin Denwa K.K. (NTT), that defects in a crystal lattice of a III-V compound semiconductor layer epitaxially grown on a silicon substrate can be reduced by subjecting the substrate to a thermal cycle annealing, i.e., changing the temperature of the substrate at least once after the layer has been grown, the upper limit to which the temperature is elevated being at least higher than the growing temperature and being held there for 3 to 7 minutes, and the temperature then being lowered to at least 300° C.

M. Tachikawa et al. report, in an article appearing in Appl. Phys. Lett. 56 (22) 2225 (1990), that approximately $10^7/cm^2$ dislocations of GaAs crystal lattice are generated in the cooling stage, due to thermal stress. This thermal stress per se is generated due to the difference in the thermal expansion coefficients of GaAs and silicon, and the lattice dislocations are generated at the interface of the GaAs layer and the silicon substrate, to thereby relax the thermal stress, and migrate during the cooling stage. Thereafter, as the temperature is lowered to the ambient temperature, the dislocations of the GaAs lattice remain and become the origin of an etch pit density. Namely, the dislocations generated during the cooling stage are a major cause of the dislocations of an epitaxially grown GaAs layer.

SUMMARY OF THE INVENTION

Therefore, the object of the present invention is to provide a process for producing a layer of a compound semiconductor on a silicon substrate in which crystal lattice defects of the compound semiconductor, particularly those generated in the cooling stage, are reduced.

According to the present invention, there is provided a process for growing a semiconductor layer on a substrate, said semiconductor having a lattice constant different from that of the material of said substrate, which comprises the steps of: heating said substrate to a semiconductor growing temperature; growing said semiconductor layer on said substrate; and then cooling said substrate, which includes a plurality of reheating steps, the respective upper limit temperatures of said reheating steps being lowered step by step (i.e., in succession), at least one of said upper limit temperatures of said reheating steps being lower than that of said semiconductor growing temperature.

Preferably, the substrate is made of silicon.

Also, preferably the semiconductor is selected from the group consisting of III-V compound, e.g., GaAs, AlGaAs, InGaAs and InP; and II-VI compound, e.g., ZnSe and ZnS.

Further, preferably the layer is grown to a thickness of from 0.5 to 5 μm.

Furthermore, preferably the layer is grown by metallorganic vapor phase deposition, or molecular beam epitaxy or atomic layer epitaxy, and is preferably grown at a temperature of from 400° C. to 800° C.

Preferably, the reheating steps are carried out by elevating the temperature in an amount of 200° C. to 300° C.

Also, preferably the reheating step is repeated from a minimum of one to a maximum of eight times.

Finally, preferably, temperature lowering steps which follow the reheating steps are temporarily interrupted.

Optionally, the substrate may be cleaned before growing the semiconductor layer, and also a thermal cycle annealing may be carried out during the layer growing step and/or between the layer growing step and the cooling step.

BRIEF DESCRIPTION OF THE DRAWINGS

FIG. 4 is a graph showing the relationship between the etch pit density and the time length of temporary interruption of lowering temperature; and FIG. 5 is a diagram of the thermal processing according to the prior art.

DESCRIPTION OF THE PREFERRED EMBODIMENTS

In the prior art, a layer of a compound semiconductor epitaxially grown on a silicon substrate generates an etch pit density of about $10^7$ cm$^{-2}$ during the cooling stage, even if a repeated thermal annealing is carried out after growth of the layer.

According to the present invention, the etch pit density due to the crystal lattice defects in the grown compound semiconductor are reduced by subjecting the substrate to a plurality of reheating steps during the cooling stage, wherein the upper limit of at least one of the respective elevated temperatures used for the reheating steps is lower than the semiconductor growing temperature.

The present invention will be explained in more detail by the following examples, in which layers of compound semiconductors of GaAs, AlGaAs, ZnSe and InP were formed on silicon substrates.

Note, other compound semiconductor layers, such as InGaAs and ZnS, also can be successfully produced according to the present invention.

EXAMPLE 1

Figure 1:
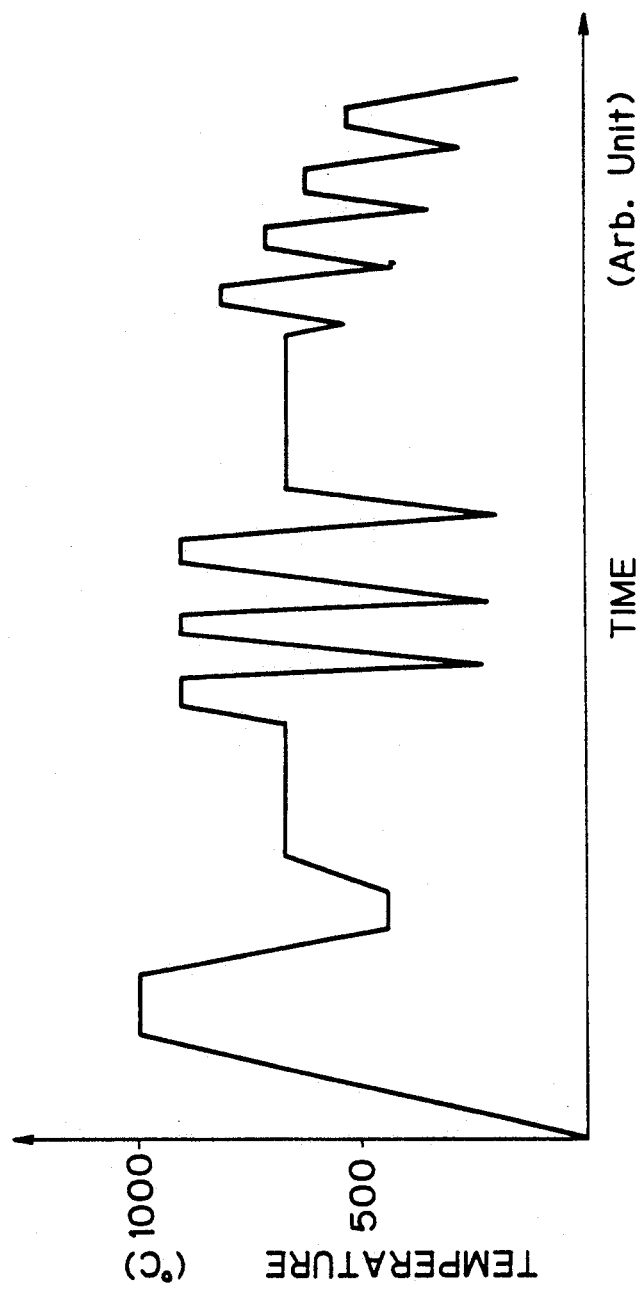
FIG. 1 is a diagram of the thermal processing according to the present invention.
Figure 2:
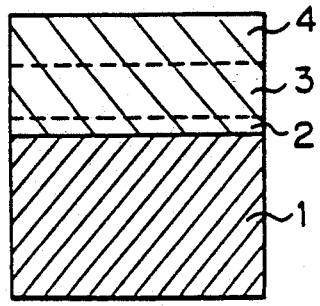
FIG. 2 is a sectional view of a silicon substrate having a compound semiconductor layer formed thereon.

FIG. 1 is a diagram showing the thermal processing carried out in Example 1 relative to the structure shown in FIG. 2.

First, a native oxide film (not shown in FIG. 2) was removed from the surface of the silicon substrate 1 of the FIG. 2 structure by flowing $H_2$ at a flow rate of 12 SLM at 1000° C. for 10 minutes, whereby the substrate was cleaned.

Then $(CH_3)_3Ga$ and $AsH_3$ were introduced at a flow rate of 8.9 SCCM and 200 SCCM, respectively, at 450° C., to produce an amorphous GaAs layer 2 having a thickness of 100 Å (FIG. 2). The temperature of the substrate was then elevated to 650° C., and $(CH_3)_3Ga$ and $ASH_3$ were introduced at a flow rate of 2.5 SCCM and 100 SCCM, respectively, whereby the amorphous GaAs layer 2 was made monocrystalline, and a monocrystalline layer of GaAs 3 was grown to a thickness of about 1 to 2 μm.

Then, a conventional thermal cycle annealing was repeated three times, in which cycle the temperature was elevated to 900° C. and held there for 5 minutes, and then lowered to 200° C.

Thereafter, the temperature was again elevated to 650° C. and the epitaxial growth of the GaAs was repeated as set forth above, whereby a GaAs layer 4 was grown to a thickness of about 1 to 2 μm.

Finally, the temperature was lowered from 650° C. to 500° C., followed by elevating the temperature in an amount of 300° C. and then lowering in an amount of 400° C. Such a reheating was repeated four times during the cooling stage. The upper limits to which the temperature was elevated were 600° C. and 500° C., in the third and fourth reheating cycles, respectively, i.e., each of the third and fourth upper temperature limits was lower than the temperature of 650° C. used during the growing stage, according to the present invention.

The silicon substrate having a GaAs layer epitaxially grown thereon was subjected to a molten KOH etching at 375° C., and then washed with water and dried in the air. The etch pit density was determined, by using an optical microscope, to be $7.9 \times 10^5$ cm$^{-2}$.

EXAMPLE 2

Figure 3:
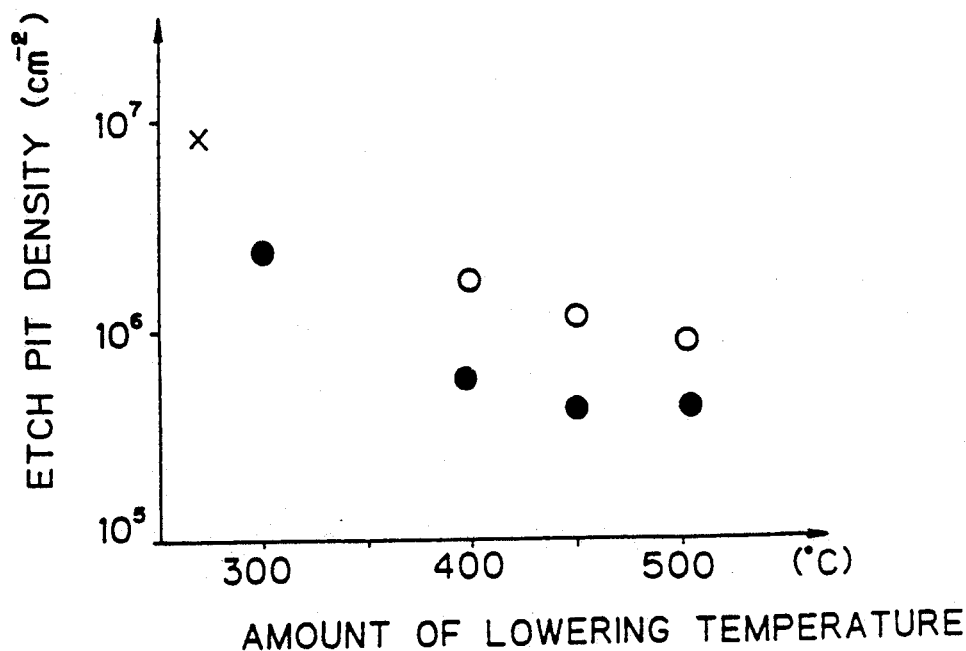
FIG. 3 is a graph showing the relationship between the etch pit density and the amount of elevating temperature in the reheating steps and the amount of lowering temperature effected thereafter.

A GaAs layer was formed on a silicon substrate as in Example 1, except that, after the epitaxial growth was finished and for two different specimens as shown by the open circle and solid circle data in FIG. 3, the temperature was elevated in an amount of 200° C. and 300° C. and then the temperature was lowered by successive amounts of from 300° C. to 500° C. in corresponding, successive cycles. The etch pit density was determined, after molten KOH etching, by an optical microscope, and it was found that the etch pit density was reduced to $7 \times 10^5$ to $4 \times 10^6$ cm$^{-2}$, compared to the $9 \times 10^6$ cm$^{-2}$ etch pitch density of the prior art, as shown in FIG. 3.

EXAMPLE 3

A GaAs layer was formed on a silicon substrate as in Example 2, except that the temperature was elevated and lowered in respective amounts of 300° C. and 400° C., and that the lowering of the temperature was interrupted for 2.5 to 10 minutes. The etch pit density was reduced to about $5 \times 10^5$ to $6 \times 10^5$ cm$^{-2}$, by an interruption of 5 to 10 minutes as shown in FIG. 4.

EXAMPLE 4 (COMPARATIVE)

The epitaxial growth of the GaAs layer was carried out as in Example 1, except that the reheating was not repeated in the cooling stage. This thermal processing procedure is shown in FIG. 5.

The etch pit density was determined by an optical microscope, after molten KOH etching, to be $9.0 \times 10^6$ cm$^{-2}$.

EXAMPLE 5

An AlGaAs layer was formed on a silicon substrate as in Example 1, except that, after an amorphous GaAs layer was grown at 450° C., to a thickness of about 100Å, the temperature of the substrate was elevated to 750° C., and $(CH_3)_3Ga$, $(CH_3)_3Al$, and $AsH_3$ were introduced at a flow rate of 2.5 SCCM, 0.96 SCCM, and 100 SCCM, respectively, whereby an AlGaAs crystal layer was epitaxially grown to a thickness of about 3 μm.

The etching pit density was determined to be $8 \times 10^5$ cm$^{-2}$, after molten KOH etching.

EXAMPLE 6

A ZnSe layer was formed on a silicon substrate as in Example 1, except that an amorphous ZnSe layer was grown on a silicon substrate at 250° C. to a thickness of about 100 Å, by introducing $(C_2H_5)_2Zn$ and $SeH_2$ at 250° C. and at a flow rate of 9 SCCM and 18 SCCM, respectively, and then a monocrystalline ZnSe layer was grown at 450° C. to a thickness of about 3 μm by introducing $(C_2H_5)_2Zn$ and $SeH_2$ at a flow rate of 9 SCCM and 20 SCCM, respectively.

The etch pit density was determined to be $8 \times 10^6$ cm$^{-2}$, after molten KOH etching.

EXAMPLE 7

An InP layer was formed on a silicon substrate as in Example 5, except that, after an amorphous GaAs layer was grown to a thickness of about 1 μm, an amorphous InP layer was grown to a thickness of about 100 Å, at 400° C., by introducing $(C_2H_5)_3In$ and $PH_3$ at a flow rate of 0.97 SCCM and 136 SCCM, respectively, and then a monocrystalline InP layer was grown to a thickness of about 2 μm, at 600° C., by introducing $(C_2H_5)_3In$ and $PH_3$ at the flow rates set forth above.

The etch pit density was determined to be $4 \times 10^6$ cm$^{-2}$, after molten KOH etching.

I claim:

1. A process for growing a semiconductor layer on a substrate, said semiconductor having a lattice constant different from that of the material of said substrate, which comprises the steps of:
   heating said substrate to a semiconductor growing temperature;
   growing said semiconductor layer on said substrate; and
   cooling said substrate including performing a plurality of reheating steps, the upper limits of the respective temperatures of said reheating steps being lowered step by step, and at least one of said upper limits of the respective temperatures of said reheating steps being lower than said semiconductor growing temperature.

2. A process according to claim 1, wherein the number of said plurality of reheating steps is in the range of from 2 to 8.

3. A process according to claim 1, wherein said substrate is made of silicon.

4. A process according to claim 1, wherein said semiconductor layer is made of a compound semiconductor selected from the group consisting of III-V compound semiconductors and II-VI compound semiconductors.

5. A process according to claim 4, wherein said compound semiconductor is selected from the group consisting of GaAs, InP, AlGaAs, InGaAs, ZnSe and Zns.

6. A process according to claim 1, wherein said semiconductor layer has a thickness of 0.5 to 5 μm.

7. A process according to claim 1, wherein said semiconductor layer is grown by a metallorganic chemical vapor phase deposition method, or a molecular beam epitaxial growth method, or an atomic layer epitaxial growth method.

8. A process according to claim 1, wherein said semiconductor layer is grown at a temperature of between 400° C. to 800° C.

9. A process according to claim 1, wherein said reheating steps are carried out by elevating the temperature in an amount of 200° C. to 300° C.

10. A process according to claim 1, wherein temperature lowering steps which follow said reheating steps are temporarily interrupted.

11. A process according to claim 1, wherein said substrate is cleaned before growing said semiconductor layer.

12. A process according to claim 1, wherein said substrate is subjected to a cyclic annealing process during said semiconductor layer growing step and/or between said semiconductor layer growing step and said cooling step.

* * * * *